United States Patent [19]

Cliff et al.

[11] Patent Number: 5,274,581
[45] Date of Patent: Dec. 28, 1993

[54] LOOK UP TABLE IMPLEMENTATION OF FAST CARRY FOR ADDERS AND COUNTERS

[75] Inventors: Richard G. Cliff, Santa Clara; L. Todd Cope, San Jose; Kerry Veenstra, Concord; Bruce B. Pedersen, Santa Clara, all of Calif.

[73] Assignee: Altera Corporation, San Jose, Calif.

[21] Appl. No.: 880,752

[22] Filed: May 8, 1992

[51] Int. Cl.$^5$ ............................................. G06F 7/50
[52] U.S. Cl. ................................. 364/784; 364/770
[58] Field of Search .................. 364/784, 770, 716; 307/465; 377/45, 49

[56] References Cited

U.S. PATENT DOCUMENTS

| | | | |
|---|---|---|---|
| 4,124,899 | 11/1978 | Birkner et al. | 364/716 |
| 4,623,982 | 11/1986 | Ware | 364/770 |
| 4,642,487 | 2/1987 | Carter | 307/465 |
| 4,706,216 | 11/1987 | Carter | 365/94 |
| 4,758,985 | 7/1988 | Carter | 365/94 |
| 4,815,022 | 3/1989 | Glaeser et al. | 364/716 |
| 4,870,302 | 9/1989 | Freeman | 307/465 |
| 5,053,647 | 10/1991 | Shicukuishi et al. | 364/716 |
| 5,059,828 | 10/1991 | Tanagawa | 364/716 |

FOREIGN PATENT DOCUMENTS 456475 11/1991 European Pat. Off. .

OTHER PUBLICATIONS

E. J. McCluskey, "Iterative Combinational Switching Networks—General Design Considerations", IRE Transactions on Electronic Computers, Dec. 1958, pp. 285-291.

R. C. Minnick, "A Survey of Microcellular Research", Journal of the Association for Computing Machinery, vol. 14, No. 2, pp. 203-241, Apr. 1967.

*Recent Developments in Switching Theory*, A. Mukhopadhyay, ed., Academic Press, New York, 1971, chapters VI and IX, pp. 229-254 and 369-422.

H. Fleisher, "An Introduction to Array Logic", IBM Journal of Research and Development, Mar. 1975, pp. 98-109.

B. Kitson et al., "Programmable Logic Chip Rivals Gate Array in Flexibility", Electronic Design, Dec. 8, 1983, pp. 95-102.

"The World's Most Versatile Logic Tool; Am-PAL22V10", Advanced Micro Devices, Inc., May 1984.

*Primary Examiner*—David H. Malzahn
*Attorney, Agent, or Firm*—Robert R. Jackson

[57] ABSTRACT

Look up tables for use in programmable logic devices are modified to facilitate use of those tables to provide adders (including subtracters) and various types of counters. Each look up table is effectively partitioned into smaller look up tables when an adder or counter is required. One portion of the partitioned table is used to provide a sum out signal, while the other portion of the partitioned table is used to provide a fast carry out signal for application to the next stage of the adder or counter.

23 Claims, 3 Drawing Sheets

LOOK UP TABLE IMPLEMENTATION OF FAST CARRY FOR ADDERS AND COUNTERS

BACKGROUND OF THE INVENTION

This invention relates to logic devices employing look up tables, and more particularly to improved ways of providing fast carry functions in such devices when the devices are to be used for such purposes as performing addition, subtraction, and counting.

Programmable logic devices are known in which programmable look up tables are used to perform relatively elementary logic functions (see, for example Wahlstrom U.S. Pat. No. 3,473,160 (FIG. 8) and commonly assigned, co-pending patent application Ser. No. 754,017, filed Sep. 3, 1991). A look up table may provide as an output any desired logical function of several inputs. The outputs of several such look up tables may be combined (e.g., by other similar look up tables) in any desired way to perform much more complex logic functions.

Look up tables which are a good size for performing many elementary logic functions in programmable logic devices tend to be too large for performing the extremely simple functions required to provide two-input adders (including subtracters) and various kinds of counters. For example, four-input look up tables are a very good size for general use, but are larger than necessary for use in the individual binary places of adders and counters. Nevertheless, adders and counters are very often required in digital logic. It is therefore wasteful to use four-input look up tables for adders and counters. This is especially so when fast carry logic is used because for each binary place one four-input look up table is required to provide the sum out bit, and another four-input look up table is required to provide the carry out bit. Neither of these look up tables is being fully utilized. Moreover, if large numbers of bit positions or places are required, the need to use two look up tables per bit position may exact a significant speed penalty because of the extensive use which must be made of the interconnect circuitry to interconnect the large number of look up tables involved.

In view of the foregoing, it is an object of this invention to provide improved ways of implementing adders (including subtracters) and counters in programmable logic devices made up of programmable look up tables.

It is a more particular object of this invention to provide programmable logic devices made up of look up tables in which adders and counters can be implemented more efficiently and with less waste of look up table resources.

It is still another more particular object of this invention to provide ways of achieving faster adders and counters in programmable logic devices made up of look up tables.

SUMMARY OF THE INVENTION

These and other objects of the invention are accomplished in accordance with the principles of the invention by adding to a look up table circuitry for allowing the look up table to be effectively partitioned into smaller look up tables, one of which performs sum out logic required for one bit position of addition, and the other of which performs carry out logic required for that same bit position. Additionally, logic may be added to selectively feed back the output of a flip-flop associated with each look up table to an input of that look up table to facilitate the use of the look up table as a counter stage. Still further logic may be added to facilitate loading and/or clearing of the flip-flop associated with each look up table to simplify the provision of loadable and/or clearable counters.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
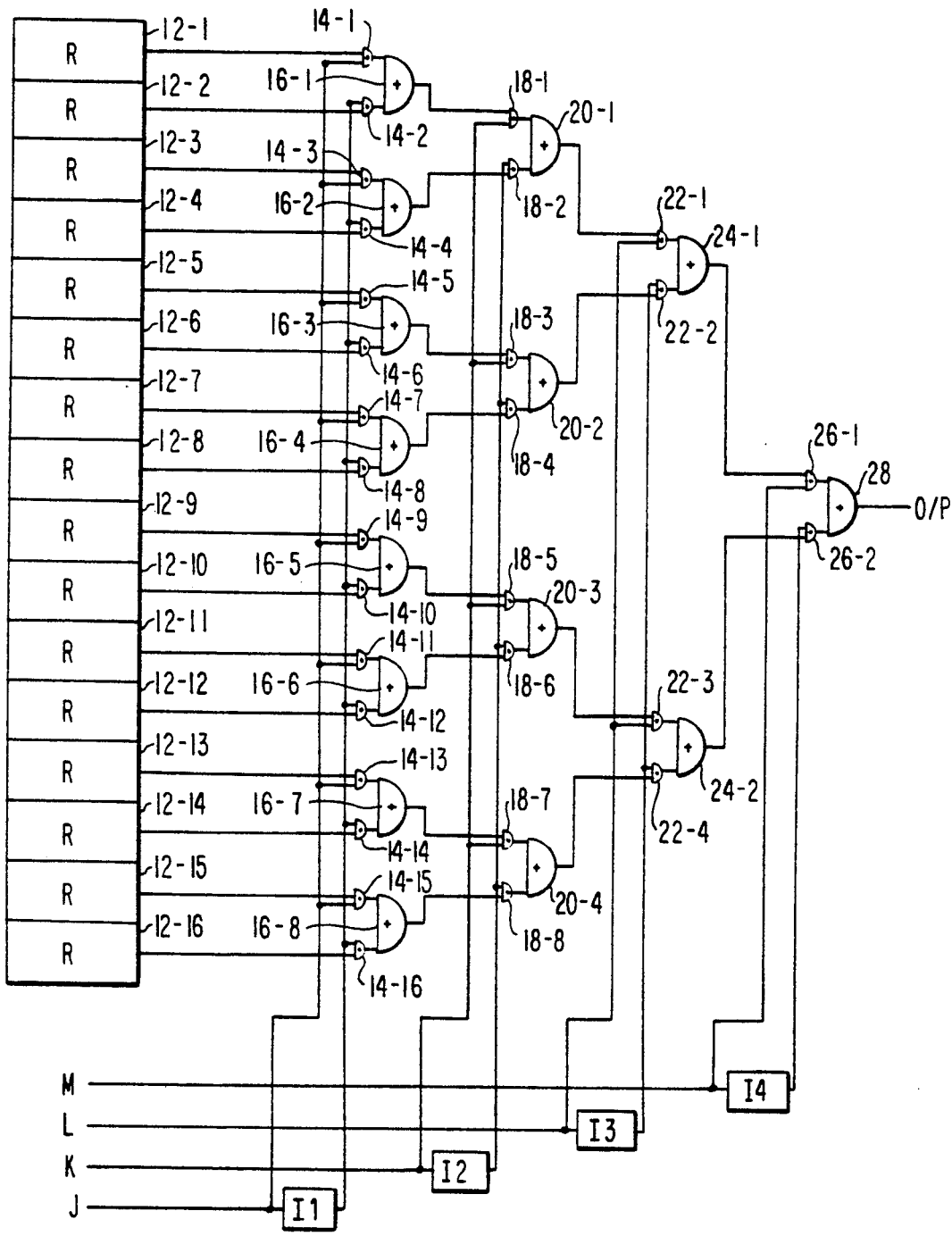
FIG. 1 is a schematic block diagram of illustrative prior art look up table apparatus.

FIG. 1 shows a conventional four-input look up table 10. Look up table 10 has 16 storage register locations or function control elements ("FCEs") 12-1 through 12-16, each of which stores one binary digit of information. Each FCE 12 may be a flip-flop (as in FIG. 8 of Wahlstrom U.S. Pat. No. 3,473,160), a random access memory ("RAM") cell, or any other type of storage device such as an SRAM, a DRAM, a cell of a first-in first out ("FIFO") memory, an EPROM, an EEPROM, a ferroelectric memory cell, a fuse (e.g., a laser fuse), an antifuse, or the like. The contents of FCEs 12 may be fixed or programmable, and if programmable may be programmable only once or repeatedly. The logic connected to the outputs of FCEs 12 allows the four inputs J-M to select one and only one of the FCE outputs as the final output O/P of the look up table. The output of each FCE 12 is applied to one input of a respective one of AND gates 14-1 through 14-16. Input J is applied to the other input of AND gates 14-1, 14-3, 14-5, 14-7, 14-9, 14-11, 14-13, and 14-15, and, after inversion by inverter I1, to the other input of AND gates 14-2, 14-4, 14-6, 14-8, 14-10, 14-12, 14—14, and 14-16. Accordingly, half of AND gates 14 are enabled by input J, while the other half of these AND gates are not enabled. OR gates 16 pass the outputs of enabled AND gates 14 to the next level of AND gates 18.

Input K is applied to one input of AND gates 18-1, 18-3, 18-5, and 18-7, and, after inversion by inverter I2, to one input of AND gates 18-2, 18-4, 18-6, and 18-8. Accordingly, input K enables half of AND gates 18 and disables the other half of those AND gates. Input K therefore selects four of the eight FCE 12 outputs selected by input J. OR gates 20 pass the four FCE outputs selected by input K to the next level of AND gates 22.

Input L is applied to one input of AND gates 22-1 and 22-3, and, after inversion by inverter I3, to one input of AND gates 22-2 and 22-4. Input L therefore enables half of AND gates 22 and disables the other half of those AND gates. Accordingly, input L selects two of the four FCE 12 outputs selected by input K. OR gates 24 pass the two FCE outputs selected by input L to the next level of AND gates 26.

Input M is applied to one input of AND gate 26-1, and, after inversion by inverter I4, to one input of AND gate 26-2. Accordingly, input M makes a final selection of one of the two FCE 12 outputs selected by input L. OR gate 28 passes this finally selected FCE output to look up table output lead O/P.

It will be apparent from the foregoing that look up table 10 can provide any single logical function of its four inputs J-M. For example, if it is desired that the output of look up table 10 should be 1 when J and L are 0 and K and M are 1, then FCE 12-6 is programmed or otherwise set to store binary 1 so that this value will appear at output O/P when AND gates 14-6, 18-3, 22-2, and 26-1 are enabled.

Figure 2:
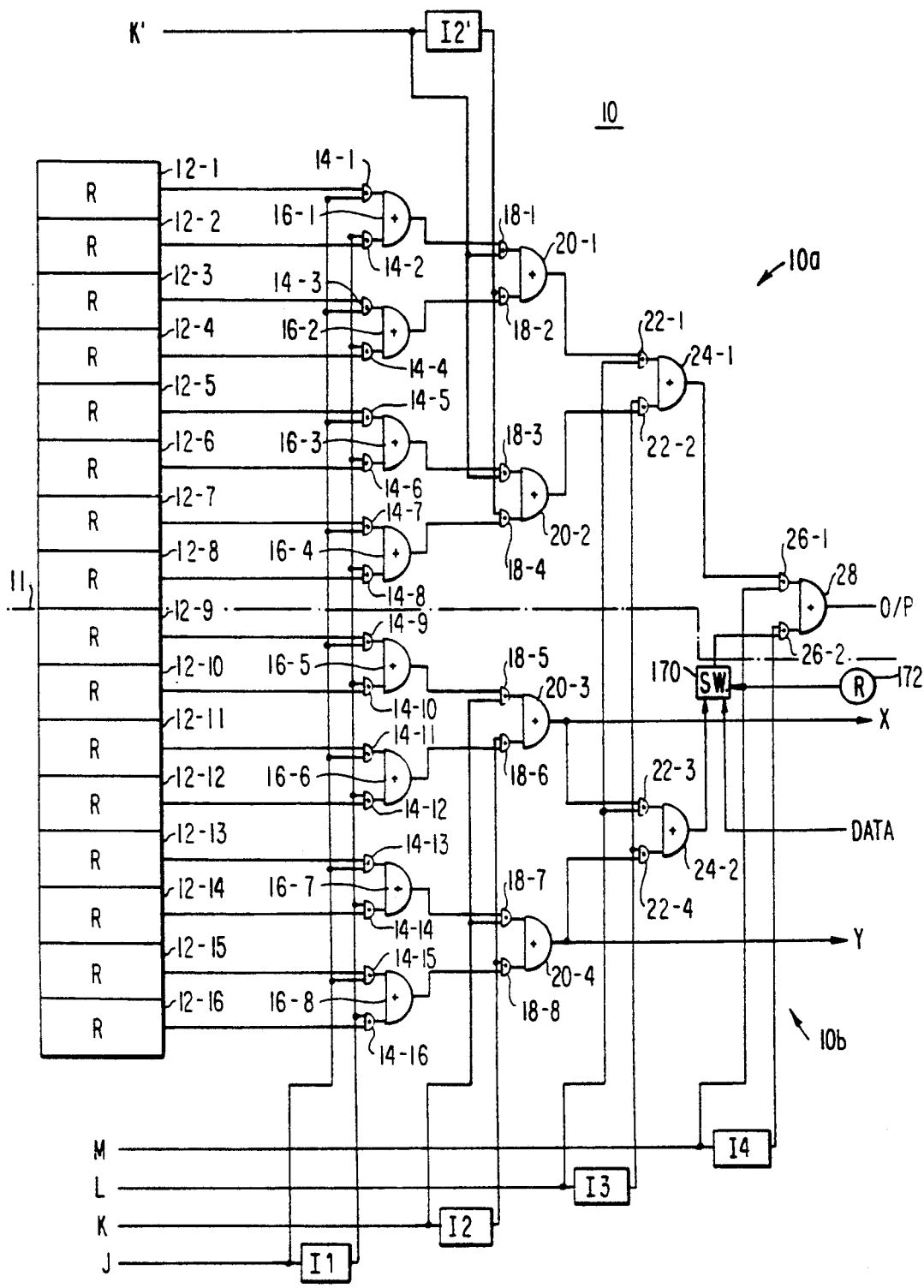
FIG. 2 is a schematic block diagram illustrating how the look up table of FIG. 1 can be modified in accordance with the principles of this invention.

If look up table 10 is to be used as one stage of a two-input adder (which term is used herein as a generic term for both adders and subtracters), it really has more capabilities than are needed to provide either the sum out or carry out value. Accordingly, look up table 10 is modified in accordance with this invention as shown in FIG. 2 so that it can provide both the sum out on normal output lead O/P and important precedents to the carry out value on leads X and Y. Prior art input K is split into two inputs K and K'. Input K continues to be applied in true or complement form to AND gates 18-5 through 18-8. Input K' is applied in true form to AND gates 18-1 and 18-3, and in complement form provided by inverter I2' to AND gates 18-2 and 18-4. An additional switch 170 is included between the output of OR gate 24-2 and the input of AND gate 26-2. Switch 170 is controlled by FCE 172 (which can be similar to any of FCEs 12) to apply either the output of OR gates 24-2 or the "data" input to AND gate 26-2. When look up table 10 is used as part of a loadable counter, the "data" input to switch 170 is used as the source of the data to be loaded into the counter.

Figure 3:
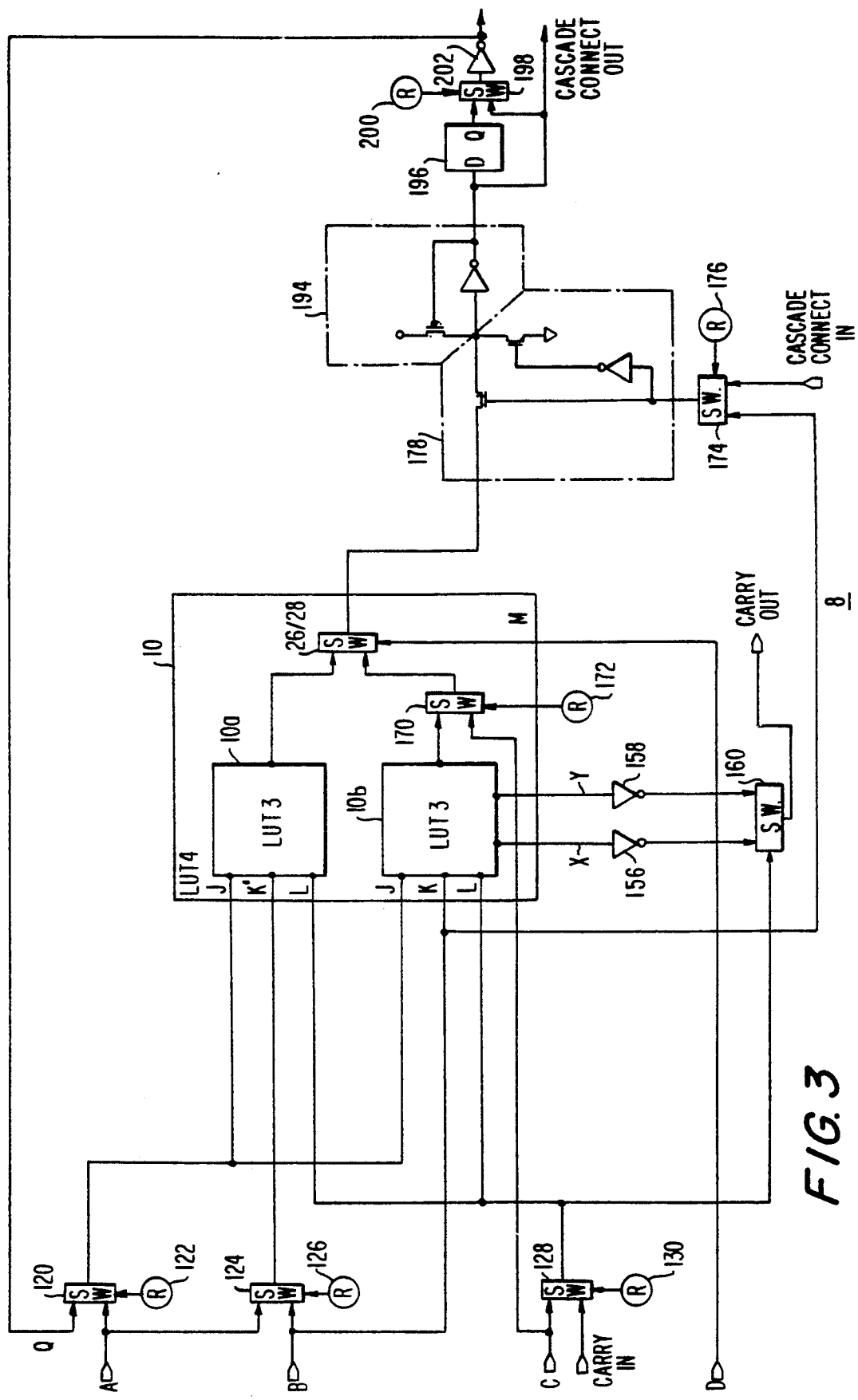
FIG. 3 is a schematic block diagram of illustrative apparatus constructed in accordance with this invention which uses the look up table apparatus of FIG. 2.

FIG. 3 shows how the modified look up table 10 of FIG. 2 can be used with other circuitry in accordance with this invention to provide an extremely flexible and powerful logic module 8 for use in programmable logic arrays (e.g., the logic arrays shown in commonly assigned, concurrently filed application Ser. No. 07/880,942. Logic module 8 has four regular data inputs A-D. It also has a carry in input, typically from the carry out output of another adjacent logic module which is used for the next less significant arithmetic place when logic module 8 is used for one place of binary addition, subtraction, or counting. The remaining input to logic module 8 is the cascade connect input, also typically from another adjacent logic module. As described in commonly assigned, concurrently filed application Ser. No. 07/880,888, the cascade connect input allows the cascade connect output signal of another logic module to be combined with the output of look up table 10 in logic module 8 if that is desired.

Logic module 8 has three outputs. These are its regular data output from output driver 202, the cascade connect output which bypasses elements 196 through 202, and the carry out signal. The cascade connect output signal of logic module 8 is applied to the cascade connect input of another, typically adjacent logic module. The carry out signal of logic module 8 is similarly applied to the carry in input of another, typically adjacent logic module which performs the next more significant place of binary addition, subtraction, or counting when any of those operations are performed.

When logic module 8 is used to perform normal logic rather than addition, subtraction, or counting, switch 120 is controlled by FCE 122 to apply the A input of the logic module to the J input of look up table 10, switch 124 is controlled by FCE 126 to apply the B input to the K' as well as the K inputs of table 10, and switch 128 is controlled by FCE 130 to apply the C input to the L input of table 10. (FCEs 122, 126, and 130 may be similar to any of the above-described FCEs.) The D input is applied at all times to the M input of table 10. Switch 170 is controlled by FCE 172 to apply the output of look up table portion 10b to switch 26/28, and switch 174 is controlled by FCE 176 to apply the cascade connect input to AND gate 178. (Again, FCEs 172 and 176 may be similar to any of the above-described FCEs.) As is discussed in above-mentioned application Ser. No. 07/880,888, the cascade connect input may be tied to logic 1 by other elements not shown herein if the cascade connect feature is not being used. As a result of the foregoing, look up table 10 in FIG. 3 operates just like the prior art look up table 10 in FIG. 1 and can produce any logical function of inputs A-D. The output signal of look up table 10 is applied to AND gate 178. After inversion and level adjustment by circuit 194, the output signal of AND gate 178 is applied to the main data output terminal of logic module 8 either directly or via flip-flop 196 as determined by switch 198 which is controlled by FCE 200 (similar to any of the above-described FCEs). The output signal of circuit 194 is also applied to the cascade connect output terminal of the logic module.

When it is desired to use logic module 8 to perform one place of binary addition, the two digits to be added are applied to the A and B inputs. The carry from the next less significant place of the addition operation (preferably performed by another logic module similar to logic module 8) is applied to the carry in input. (Above-mentioned application Ser. No. 07/880,942, which is hereby incorporated by reference herein, shows how multiple logic modules can be connected to one another in a carry chain when operations such as addition, subtraction, and counting are to be performed.) Switches 120, 124, and 174 are set as described above for normal logic, but switch 128 is set to apply the carry in input to the L input of table 10, and also to the control input of switch 160. The setting of switch 170 is of no consequence. The cascade connect input is tied to logic 1. Input D is used to control switch 26/28 to apply the output of look up table portion 10a to AND gate 178. The FCEs 12 of look up table portion 10a (generally the portion above chain dotted line 11 in FIG. 2) are programmed to apply the sum of A, B, and carry in to switch 26/28. This sum out signal passes through elements 26/28, 178, 194, etc., to the main output terminal of the logic module. The FCEs 12 of look up table portion 10b (generally the portion below chain dotted line 11 in FIG. 2) are programmed to provide the NOR and NAND of A and B on leads X and Y. These signals are inverted by inverters 156 and 158, and switch 160 selects the appropriate one for use as the carry out signal based on the carry in signal which controls that switch. The carry out signal of this logic module is the carry in signal of another similar logic module which performs the next more significant place of the arithmetic operation. (See again above-mentioned application Ser. No. 07/880,942 which shows how the carry out signal of each logic module is connected as the carry in signal of the arithmetically next more significant logic module.) Accordingly, with the modifications described above, a single logic module 8 can provide both the sum out and carry out signals for one place of binary addition.

Another capability of logic module 8 in accordance with this invention is to provide one stage of a binary up/down counter which can also be loaded to any value. This counter stage operates by adding the Q output of flip-flop 196 and the carry in input from the logic module providing the next less significant counting stage. Accordingly, switches 198 and 120 are set to apply the Q output to look up table input J, switch 124 is set to apply the A input to look up table input K', and switch 128 is set to apply the carry in input to look up table input L. Input B continues to be applied to look up table input K, input C continues to be applied to switch 170, and input D continues to be applied to look up table input M to control switch 26/28. Switch 170 is programmed to pass the applied C input to switch 26/28. Switch 174 is set to apply the cascade connect input to one input of AND gate 178. The cascade connect input signal is tied to logic 1 as described above. The FCEs 12 of look up table portion 10a are programmed so that the A input can selectively enable counting. The FCEs 12 of look up table portion 10b are programmed so that the B input can control whether the counter counts up or down. The up/down counter can be loaded with data from input C by using input D to momentarily cause switch 26/28 to apply the output of switch 170 to AND gate 178. Flip-flop 196 stores the output of AND gate 178 synchronously or asynchronously, depending on how the flip-flop is configured and what control signals are applied to it.

Still another capability of logic module 8 in accordance with this invention is to provide one stage of a clearable binary counter which can also be loaded to any value. This type of counter also counts by adding its Q output to the carry in input from the counter stage of next lower numerical significance. Unlike the above-described up/down counter, however, the clearable counter can only count up. To provide the clearable counter, switches 120, 124, 128, 170, and 198 are all set as described above for the up/down counter. Switch 174 is set to apply the B input to AND gate 178. The FCEs 12 of look up table portion 10a are programmed so that input A can selectively enable the counting action. Input B must also be logic 1 for the counter to count or hold its count. When it is desired to clear the counter, input B is switched to logic 0 which applies to 0 to the D input of flip-flop 196. Again, this clears flip-flop 196 either synchronously or asynchronously, depending on how the flip-flop is configured and what control signals are applied to it. The counter can be loaded with any desired value from the C input in the same way that the up/down counter can be loaded.

It will be understood that the foregoing is merely illustrative of the principles of this invention, and that various modifications can be made by those skilled in the art without departing from the scope and spirit of the invention. For example, there are many other ways in which the apparatus of this invention can be configured and/or programmed to perform the functions described above. As one illustration of this, X and Y could be the NOR and NAND of one of inputs A and B and the carry in input, with the other one of inputs A and B being used to control switch 160.

The invention claimed is:

1. In programmable look table apparatus which includes a plurality of programmable data storage cells, each of which produces a cell output signal indicative of the data stored in that cell, and means for normally selecting from all of said cell output signals any one of said cell output signals as a normal output signal on a normal output lead of said look up table apparatus, said means for normally selecting being responsive to a plurality of first input signals such that each of said first input signals normally controls a respective one of a plurality of successive selection means which collectively comprise said means for selecting, a first of said selection means selecting one of two mutually exclusive and collectively exhaustive subsets of said cell output signals, and each succeeding selection means selecting one of two mutually exclusive and collectively exhaustive subsets of the cell output signals selected by the preceding selection means until a final one of said selection means produces said normal output signal on said normal output lead, an improvement for allowing said look up table apparatus to produce on an auxiliary output lead, which is separate from said normal output lead, an auxiliary output signal so that when said look up table apparatus is used to perform addition, one of said normal and auxiliary output signals can be used to generate a sum out digit signal, while the other of said normal and auxiliary output signals can be used to generate a carry out digit signal, said improvement comprising:

means for selectively applying a second input signal to a first portion of a predetermined one of said selection means in lieu of the first input signal that would normally be applied to said first portion and a remaining second portion of said predetermined selection means so that said second input signal can control said first portion to select from among the cell output signals applied to said first portion independently of the selection made by said second portion from among the cell output signals applied to said second portion in response to the first input signal which is still applied to said second portion; and means for connecting said auxiliary output lead to a predetermined one of said first and second portions for providing as said auxiliary output signal on said auxiliary output lead a cell output signal selected by said predetermined one of said portions.

2. The apparatus defined in claim 1 wherein said predetermined one of said portions selects two of said cell output signals, wherein said means for connecting connects said auxiliary output lead to said predetermined one of said portions so that a first of the two cell output signals selected by said predetermined one of said portions is applied to said auxiliary output lead, and wherein said improvement further comprises a further auxiliary output lead connected to said predetermined one of said portions so that said further auxiliary output lead receives a second of the two cell output signals selected by said predetermined one of said portions.

3. The apparatus defined in claim 2 wherein, when said look up table apparatus is used to perform addition, one of said first and second input signals is a carry in signal from the next less significant place of the addition, and wherein said improvement further comprises:

means responsive to said carry in signal for selecting one of said auxiliary and further auxiliary output signals as the source for said carry out signal.

4. The apparatus defined in claim 3 wherein said means responsive to said carry in signal comprises means for inverting at least the one of said auxiliary and further auxiliary output signals which is selected as the source for said carry out signal.

5. The apparatus defined in claim 1 wherein said predetermined one of said selection means is separated from said final selection means by at least one other of said selection means.

6. The apparatus defined in claim 5 wherein, when said look up table apparatus is used to perform addition, said final selection means is used to prevent any of said cell output signals which can be applied to said auxiliary output lead from being applied to said normal output lead.

7. The apparatus defined in claim 1 wherein, when said look up table apparatus is used for addition, said normal output signal is used to generate said sum out digit signal, and wherein said apparatus further comprises:
means for selectively feeding back said sum out digit signal as one of said first and second input signals.

8. The apparatus defined in claim 1 wherein said plurality of data storage cells consists of sixteen data storage cells.

9. The apparatus defined in claim 8 wherein said plurality of successive selection means consists of four successive selection means.

10. The apparatus defined in claim 9 wherein said predetermined one of said selection means is the one in the succession of selection means which immediately follows said first selection means.

11. The apparatus defined in claim 10 wherein each of the subsets selectable by said first selection means consists of eight of said cell output signals.

12. The apparatus defined in claim 11 wherein each of the subsets selectable by said predetermined one of said selection means consists of four of the eight cell output signals selected by said first selection means.

13. The apparatus defined in claim 12 wherein said first portion of said predetermined selection means selects two cell output signals from a first half of the eight cell output signals selected by said first selection means, and wherein said second portion of said predetermined selection means selects two cell output signals from a second half of the eight cell output signals selected by said first selection means.

14. The apparatus defined in claim 13 wherein said means for connecting connects to said auxiliary output lead a first one of the two cell output signals selected by said predetermined one of said first and second portions.

15. The apparatus defined in claim 14 further comprising:
a further auxiliary output lead for receiving a second one of the two cell output signals selected by said predetermined one of said first and second portions; and
means responsive to one of said first and second input signals for selecting one of the signals on said auxiliary and further auxiliary output leads as the source for said carry-out signal.

16. The apparatus defined in claim 15 wherein said means responsive to one of said first and second input signals comprises means for inverting the signals on said auxiliary and further auxiliary output leads.

17. Programmable logic apparatus comprising:
a look up table for using a plurality of look up table inputs to select a plurality of look up table outputs from among a plurality of predetermined values stored in said look up table;
means for storing a first of said look up table outputs;
means for receiving a plurality of input signals;
means for receiving a carry in signal;
a first switch for selectively applying either a first of said input signals or the output of said means for storing to a first of said look up table inputs;
a second switch for selectively applying either said first input signal or a second of said input signals to a second of said look up table inputs, said second input signal also being applied to a third of said look up table inputs;
a third switch for applying either a third of said input signals or said carry in signal to a fourth of said look up table inputs; and
means for applying a fourth of said input signals to a fifth of said look up table inputs.

18. The apparatus defined in claim 17 wherein said first, second, and fourth look up table inputs select a first value from among a first subset of said predetermined values, wherein said first, third, and fourth look up table inputs select a second value from among a separate second subset of said predetermined values, and wherein said fifth look up table input selects one of said first and second values as said first look up table output.

19. The apparatus defined in claim 18 wherein said second subset is divided into separate third and fourth subsets of said predetermined values, wherein said first and third look up table inputs select a second look up table output from among said third subset of predetermined values, and wherein said first and third look up table inputs select a third look up table output from among said fourth subset of predetermined values.

20. The apparatus defined in claim 19 further comprising:
means for deriving a carry out value from said second and third look up table outputs.

21. The apparatus defined in claim 20 wherein said means for deriving is responsive to the output signal of said third switch.

22. The apparatus defined in claim 18 further comprising:
a fourth switch for selectively substituting said third input signal for said second value selected by said first, third, and fourth inputs and for thereby making said third input signal said second value.

23. The apparatus defined in claim 17 a fifth switch for selectively substituting said second input signal for said first look up table output so that said second input signal can be used to clear said means for storing.

* * * * *

UNITED STATES PATENT AND TRADEMARK OFFICE
CERTIFICATE OF CORRECTION

PATENT NO. : 5,274,581
DATED : December 28, 1993
INVENTOR(S) : Richard G. Cliff, et al.

It is certified that error appears in the above-indentified patent and that said Letters Patent is hereby corrected as shown below:

| Column | Line | |
|--------|------|---|
| 1 | 13 | After "example" insert a comma. |
| 5 | 64 | After "look" insert --up--. |
| 8 | 54 | After "claim 17" insert --further comprising:--. |

Signed and Sealed this

Twenty-eighth Day of June, 1994

Attest:

BRUCE LEHMAN

*Attesting Officer*  *Commissioner of Patents and Trademarks*